United States Patent
Kim

(10) Patent No.: US 11,271,320 B2
(45) Date of Patent: Mar. 8, 2022

(54) ANTENNA SYSTEM FOR VEHICLE AND METHOD OF CONTROLLING THE SAME

(71) Applicants: Hyundai Motor Company, Seoul (KR); Kia Motors Corporation, Seoul (KR)

(72) Inventor: Joo Young Kim, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 83 days.

(21) Appl. No.: 16/703,260

(22) Filed: Dec. 4, 2019

(65) Prior Publication Data
US 2020/0335876 A1  Oct. 22, 2020

(30) Foreign Application Priority Data
Apr. 22, 2019 (KR) .......... 10-2019-0046708

(51) Int. Cl.
| | |
|---|---|
| *H01Q 19/06* | (2006.01) |
| *H01Q 19/08* | (2006.01) |
| *H01Q 25/00* | (2006.01) |
| *H01Q 1/32* | (2006.01) |
| *H01Q 15/02* | (2006.01) |
| *H01L 41/047* | (2006.01) |

(52) U.S. Cl.
CPC ......... *H01Q 19/062* (2013.01); *H01L 41/047* (2013.01); *H01Q 1/3208* (2013.01); *H01Q 1/3233* (2013.01); *H01Q 15/02* (2013.01); *H01Q 19/08* (2013.01); *H01Q 25/002* (2013.01)

(58) Field of Classification Search
CPC .... H01L 41/047; H01Q 19/062; H01Q 19/06; H01Q 1/32; H01Q 1/3208; H01Q 15/02; H01Q 3/44; H01Q 3/46; H01Q 15/04; H01Q 15/06; H01Q 15/08; H01Q 15/10; H01Q 15/12; H01Q 1/3233; H01Q 19/08; H01Q 25/002
See application file for complete search history.

(56) References Cited

U.S. PATENT DOCUMENTS

| | | | | |
|---|---|---|---|---|
| 5,883,603 | A * | 3/1999 | Kim ....... | H01Q 3/443 343/785 |
| 2006/0139206 | A1* | 6/2006 | Nagasaku ...... | H01Q 19/062 342/104 |
| 2020/0412005 | A1* | 12/2020 | Olk ........... | G01S 7/02 |

* cited by examiner

*Primary Examiner* — Andrea Lindgren Baltzell
*Assistant Examiner* — Yonchan J Kim
(74) *Attorney, Agent, or Firm* — Mintz Levin Cohn Ferris Glovsky and Popeo, P.C.; Peter F. Corless

(57) ABSTRACT

An antenna system for a vehicle includes a signal processor configured to perform signal processing of a transmission signal; a signal converter configured to convert an output signal of the signal processor between analog and digital; a beam selector configured to form a desired form of a radio wave radiation pattern; and a variable lens configured to cause an output signal of the beam selector to have a directivity in a desired direction through a change in shape according to an electrical signal applied to the variable lens.

16 Claims, 7 Drawing Sheets

(A)

(B)

(C)

(A)  (B)

(A)  (B)

ANTENNA SYSTEM FOR VEHICLE AND METHOD OF CONTROLLING THE SAME

CROSS-REFERENCE TO RELATED APPLICATION(S)

This application claims under 35 U.S.C. § 119 the benefit of Korean Patent Application No. 10-2019-0046708, filed on Apr. 22, 2019 in the Korean Intellectual Property Office, the entire contents of which are incorporated herein by reference.

BACKGROUND

1. Technical Field

The present disclosure relates to a vehicle, more particularly, to the vehicle provided with an antenna system.

2. Description of the Related Art

An important requirement for autonomous driving and connected cars is high-speed communication and large-capacity communication. Millimeter-wave communication is essential for the high-speed communication and the large-capacity communication. However, since a communication range of the millimeter-wave communication is comparatively short, in order to use the millimeter-wave communication as a communication system of a vehicle that performs communication while driving, it is necessary to increase a directivity in a specific direction so as to enhance communication stability with a target vehicle and to compensate for shortcomings of the short communication range.

SUMMARY

According to an aspect of the present disclosure, there is provided an antenna system that is simple in structure, low in cost, and can provide high communication stability.

It is an aspect of the present disclosure to provide an antenna system including: a signal processor configured to perform signal processing of a transmission signal; a signal converter configured to convert an output signal of the signal processor between analog and digital; a beam selector configured to form a desired form of a radio wave radiation pattern; and a variable lens configured to cause an output signal of the beam selector to have a directivity in a desired direction through a change in shape according to an electrical signal applied to the variable lens.

The variable lens includes: a piezoelectric material; and a lattice-shaped electrode.

The piezoelectric material contracts or expands according to an electrical signal applied to the electrode.

The electrode comprises a (+) polarity electrode and a (−) polarity electrode; the (+) polarity electrode and the (−) polarity electrode are spaced apart from each other; and a space between the (+) polarity electrode and the (−) polarity electrode is filled with the piezoelectric material.

A shape of the variable lens is changed by contraction or expansion of the piezoelectric material, and the output signal of the beam selector has the directivity in the desired direction in accordance with the change in shape of the variable lens.

The shape of the variable lens is changed according to a change in an electrical signal applied to the electrode; a refractive index of the variable lens is changed according to the change in shape of the variable lens; and the direction of the output signal of the beam selector is changed as the refractive index of the variable lens changes.

The output signal of the beam selector having the directivity in the desired direction is transmitted to at least one of a vehicle and a mobile device.

It is another aspect of the present disclosure to provide a method of controlling an antenna system comprising: performing, by a signal processor, signal processing of a transmission signal; converting, by a signal converter, an output signal of the signal processor between analog and digital; forming, by a beam selector, a desired form of a radio wave radiation pattern; and applying, by control of a controller, an electrical signal to a variable lens, and causing an output signal of the beam selector to have a directivity in a desired direction through a change in shape according to the electrical signal applied to the variable lens.

The variable lens comprises: a piezoelectric material; and a lattice-shaped electrode.

The piezoelectric material contracts or expands according to the electrical signal applied to the electrode.

The electrode comprises a (+) polarity electrode and a (−) polarity electrode; the (+) polarity electrode and the (−) polarity electrode are spaced apart from each other; and a space between the (+) polarity electrode and the (−) polarity electrode is filled with the piezoelectric material.

A shape of the variable lens is changed by contraction or expansion of the piezoelectric material, and the output signal of the beam selector has the directivity in the desired direction in accordance with the change in shape of the variable lens.

The shape of the variable lens is changed according to a change in an electrical signal applied to the electrode; a refractive index of the variable lens is changed according to the change in shape of the variable lens; and the direction of the output signal of the beam selector is changed as the refractive index of the variable lens changes.

The output signal of the beam selector having the directivity in the desired direction is transmitted to at least one of a vehicle and a mobile device.

It is yet another aspect of the present disclosure to provide an antenna system including: a signal processor configured to perform signal processing of a transmission signal; a signal converter configured to convert an output signal of the signal processor between analog and digital; a beam selector configured to form a desired form of a radio wave radiation pattern; and a variable lens configured to comprise an electrode comprising a (+) polarity electrode and a (−) polarity electrode, wherein: the (+) polarity electrode and the (−) polarity electrode are spaced apart from each other; a space between the (+) polarity electrode and the (−) polarity electrode is filled with a piezoelectric material; and an output signal of the beam selector has a directivity in a desired direction as the piezoelectric material contracts or expands according to an electrical signal applied to the (+) polarity electrode and the (−) polarity electrode.

The shape of the variable lens is changed according to a change in an electrical signal applied to the electrode; a refractive index of the variable lens is changed according to the change in shape of the variable lens; and the direction of the output signal of the beam selector is changed as the refractive index of the variable lens changes.

It is yet another aspect of the present disclosure to provide a method of controlling an antenna system including: performing, by a signal processor, signal processing of a transmission signal; converting, by a signal converter, an output signal of the signal processor between analog and digital; forming, by a beam selector, a desired form of a radio wave radiation pattern; and applying, by control of a controller, an electrical signal to a variable lens, wherein: the variable lens includes an electrode comprising a (+) polarity electrode and a (−) polarity electrode; the (+) polarity electrode and the (−) polarity electrode are spaced apart from each other; a space between the (+) polarity electrode and the (−) polarity electrode is filled with a piezoelectric material; and an output signal of the beam selector has a directivity in a desired direction as the piezoelectric material contracts or expands according to an electrical signal applied to the (+) polarity electrode and the (−) polarity electrode.

The shape of the variable lens is changed according to a change in an electrical signal applied to the electrode; a refractive index of the variable lens is changed according to the change in shape of the variable lens; and the direction of the output signal of the beam selector is changed as the refractive index of the variable lens changes.

It is yet another aspect of the present disclosure to provide a vehicle including: a signal processor configured to perform signal processing of a transmission signal; a signal converter configured to convert an output signal of the signal processor between analog and digital; a beam selector configured to form a desired form of a radio wave radiation pattern; and a variable lens configured to cause an output signal of the beam selector to have a directivity in a desired direction through a change in shape according to an electrical signal applied to the variable lens.

It is yet another aspect of the present disclosure to provide a method of controlling an antenna system for a vehicle including: performing, by a signal processor, signal processing of a transmission signal; converting, by a signal converter, an output signal of the signal processor between analog and digital; forming, by a beam selector, a desired form of a radio wave radiation pattern; and applying, by controlling of a controller, an electrical signal to a variable lens, and causing an output signal of the beam selector to have a directivity in a desired direction through a change in shape according to the electrical signal applied to the variable lens.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

It is understood that "vehicle" or "vehicular" or other similar terms as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will he further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or he like. Examples of computer readable media include, but are not limited to, ROM, RAM, compact disc (CD)-ROMs, magnetic tapes, floppy disks, flash drives, smart cards and optical data storage devices. The computer readable medium also be distributed in network coupled computer systems so that the computer readable media is stored and executed in a distributed fashion, e.g., by a telematics server or a Controller Area Network (CAN).

Figure 1:
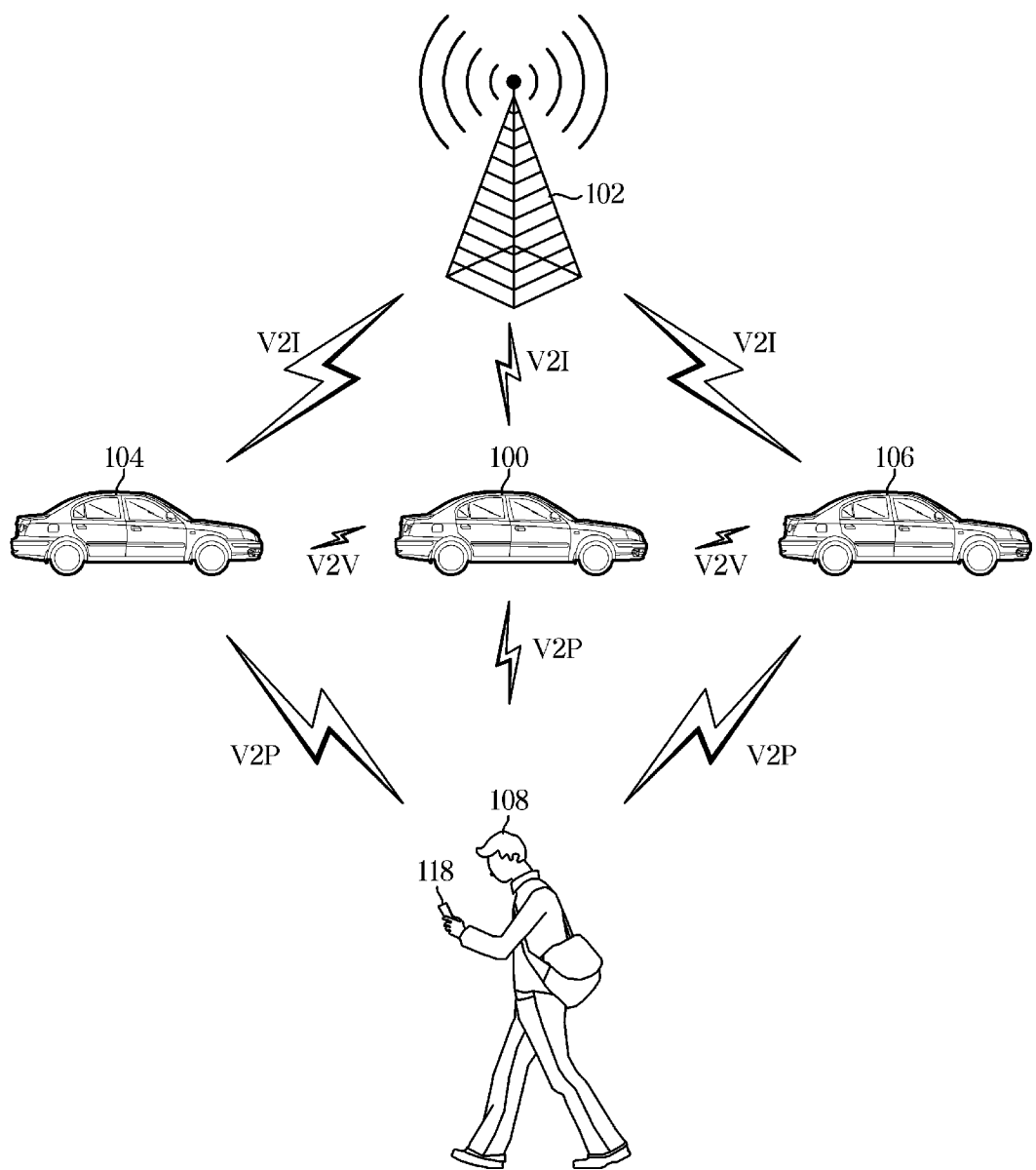
FIG. 1 is a view illustrating V2X communication of a vehicle according to an embodiment of the present disclosure.

FIG. 1 is a view illustrating V2X communication of a vehicle according to an embodiment of the present disclosure.

V2X communication refers to "Vehicle to Everything" and can be interpreted as communication between a vehicle and an object (or person). As shown in FIG. 1, in the V2X communication, a vehicle 100 and other vehicles while driving exchange and share road infrastructure information, traffic information, pedestrian information, etc. through wireless communication. The V2X communication that is implemented around the vehicles includes Vehicle to Infrastructure (V2I), Vehicle to Vehicle (V2V), and Vehicle to Pedestrian (V2P).

The vehicle 100 according to the embodiment of the present disclosure acquires information on the peripheral of the vehicle 100 by communicating through the V2X communication with a V2X base station 102, other vehicles 104 and 106, or a mobile device 118 of a pedestrian 108. To this end, the vehicle 100 performs the V2I communication (Vehicle to Infrastructure Communication) with the V2X base station 102, performs the V2V communication (Vehicle to Vehicle Communication) with the other vehicles 104 and 106, or the V2P communication (Vehicle to Pedestrian) with the mobile device 118 of the pedestrian 108. The V2P communication specifically refers to communication with the mobile device 118 carried by the pedestrian 108, rather than communication with the pedestrian 108.

The vehicle 100 performs bidirectional communication to create a safe and pleasant driving environment by exchanging messages through the V2I communication, the V2V communication, and the V2P communication.

One of the main points in terms of autonomous driving and connected cars is high-speed communication and large-capacity communication Millimeter-wave communication is essential for the high-speed communication and the large-capacity communication. However, since the communication range of the millimeter-wave communication is comparatively short, in order to use the millimeter-wave communication as a communication system of the vehicle that performs communication while driving in most cases, it is required to increase a directivity in a specific direction so as to enhance the communication stability with a target vehicle and to compensate for the shortcomings of the short communication range. An antenna system of the vehicle 100 according to the embodiment of the present disclosure uses a beam-forming technique for improving the directivity in a desired direction. The beam-forming technique is very advantageous for ensuring communication stability by improving reception sensitivity because a communication signal is transmitted by concentrating the energy of the communication signal in the desired specific direction.

The antenna system of the vehicle 100 according to the embodiment of the present disclosure uses a variable lens in place of an existing phase shift in order to realize the directivity in the desired specific direction. Particularly, the antenna system of the vehicle according to the embodiment of the present disclosure uses the variable lens implemented with a piezoelectric element. The variable lens will be described in detail with reference to FIGS. 2 to 7, which will be described later.

Figure 2:
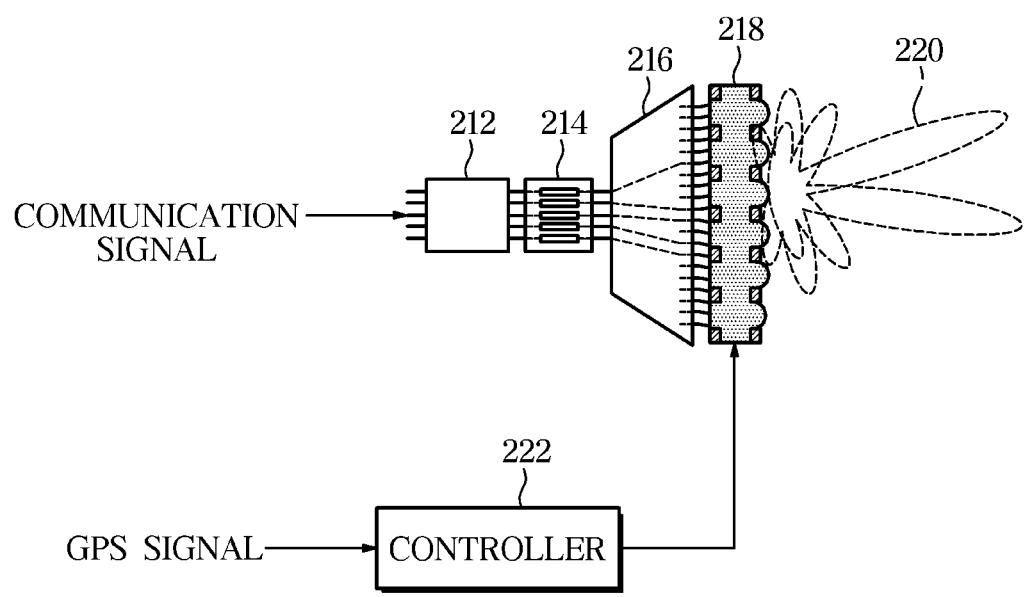
FIG. 2 is a view illustrating an antenna system of a vehicle according to an embodiment of the present disclosure.

FIG. 2 is a view illustrating an antenna system of a vehicle according to an embodiment of the present disclosure.

As shown in FIG. 2, the communication signal to be transmitted from the vehicle 100 is subjected to signal processing in a digital signal processor 212, which is a signal processor, and is converted into a signal form in an AD/DA converter 214, and then transmitted to a beam selector 216. The AD/DA converter 214 converts the communication signal from analog to digital or from digital to analog. The beam selector 216 combines arrays of antenna beams and adjusts the output of the antenna in each combination of the arrays to form a radio wave radiation pattern of the entire antenna system in a desired shape.

The output signal of the beam selector 216 has the directivity in the desired direction by a variable lens 218 according to the embodiment of the present disclosure and is transmitted in the desired direction by the directivity. That is, the communication signal to be transmitted from the vehicle 100 according to the embodiment of the present disclosure can be directed and transmitted in the desired direction by the variable lens 218 of the antenna system.

The function of the variable lens 218 for giving the directivity to the communication signal is controlled by a controller 222. The controller 222 obtains positional information of a signaling target object (for example, the other vehicle 106) from a GPS signal, determines the desired direction, that is, the direction to transmit the signal, based on the positional information of the signaling target object, and controls the variable lens 218 so that the signal to be transmitted has directivity and is transmitted in the desired direction. The controller 222 can obtain the coordinates of the current position of the vehicle 100 from the GPS signal. The controller 222 also acquires the positional information (GPS coordinates) of the other vehicle 106 to which the signal is to be transmitted, compares the current position of the other vehicle 106 with the current position of the other vehicle 106, and controls the direction of the transmission signal by controlling the variable lens 218 according to the detected relative distance and the relative direction. The variable lens 218 is operated by the control of the controller 222 to form a directional beam 220.

Figure 3:
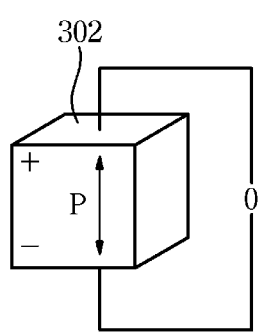
FIG. 3 is a view illustrating a principle of a variable lens of an antenna system according to the embodiment of the present disclosure.
Figure 3:
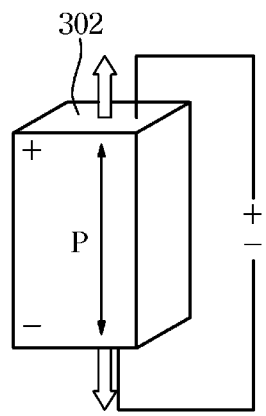
Figure 3:
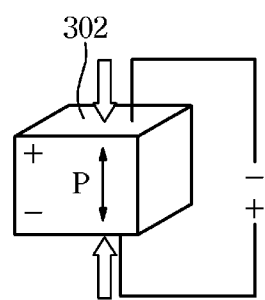

FIG. 3 is a view illustrating a principle of a variable lens of an antenna system according to the embodiment of the present disclosure. As shown in FIG. 3, the variable lens 218 of the antenna system according to the embodiment of the present disclosure implements beam directivity using a principle of a piezoelectric element.

FIG. 3A is a view illustrating a state in which no current is applied to a piezoelectric element 302. If no current is applied to the piezoelectric element 302, the piezoelectric element 302 maintains a basic shape (no changing of the shape).

FIG. 3B is a view illustrating a state in which a current is applied to the piezoelectric element 302 and a current of the same polarity current is applied to the piezoelectric element 302. That is, when a (+) polarity current is applied to a (+) electrode of the piezoelectric element 302 and a (−) polarity current is applied to a (−) electrode of the piezoelectric element 302, as shown in FIG. 3B, the volume of the piezoelectric element 302 increases more than the basic shape of the piezoelectric element 302.

FIG. 3C is a view illustrating a state in which a current having a polarity opposite to that of the electrode is applied to the piezoelectric element 302. That is, when the (+) polarity current is applied to the (+) electrode of the piezoelectric element 302 and the (+) polarity current is applied to the (−) electrode of the piezoelectric element 302, as shown in FIG. 3C, the volume of the piezoelectric element 302 becomes smaller than the basic shape of the piezoelectric element 302.

The variable lens 218 of the antenna system according to the embodiment of the present disclosure can be implemented using a characteristic of the piezoelectric element 302 as described above. That is, when the current is applied to the variable lens 218, the shape of the variable lens 218 can be changed by changing the polarity and the magnitude of the current with respect to the polarity of the electrode, and, by changing the shape of the variable lens 218, the direction of the beam from the variable lens 218 can be freely changed. The variable lens 218 according to the embodiment of the present disclosure is not limited to the piezoelectric element 302 and may be realized by using another material that can change its shape by using an electrical signal.

Figure 4:
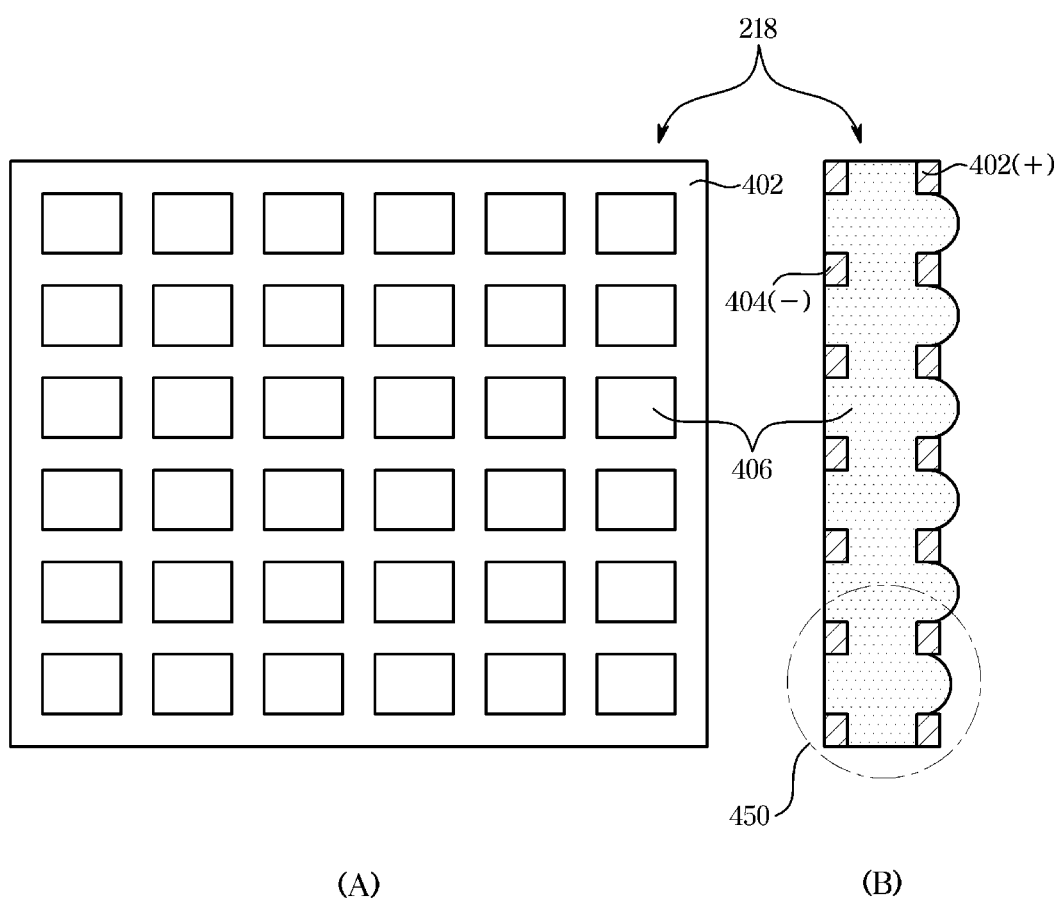
FIG. 4 is a view illustrating a variable lens of an antenna system according to an embodiment of the present disclosure.

FIG. 4 is a view illustrating a variable lens of an antenna system according to an embodiment of the present disclosure. FIG. 4A is a front view of the variable lens 218, and FIG. 4B is a side sectional view of the variable lens 218.

As shown in FIG. 4, the variable lenses 218 of the antenna system according to the embodiment of the present disclosure is arranged such that lattice-shaped electrodes 402 and 404 are spaced apart from each other, and a space formed between the two electrodes 402 and 404 are filled with a piezoelectric material 406. In FIG. 4, the electrodes 402 and 404 are a kind of current bar in which the electrode 402 is a positive electrode and the electrode 404 is a negative electrode. Therefore, the shape of the piezoelectric material 406 changes according to the polarity and magnitude of the current applied to each of the two electrodes 402 and 404. The direction of the beam (signal) is determined depending on the shape of the piezoelectric material 406 between the electrodes 402 and 404 in the lattice form.

Figure 5:
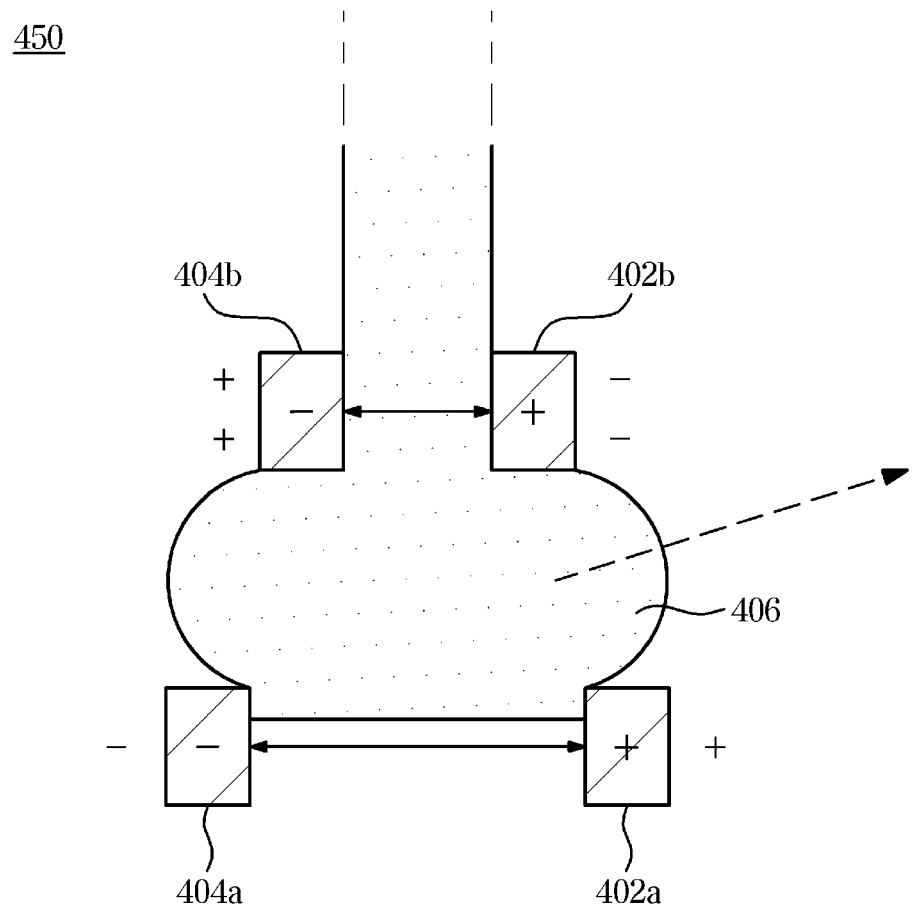
FIG. 5 is a view illustrating an enlarged view of a portion indicated by reference numeral 450 in FIG. 4.

Referring to FIG. 5, the direction of the beam according to the change of the shape of the piezoelectric material 406 will be described in detail.

FIG. 5 is a view illustrating an enlarged view of a portion indicated by reference numeral 450 in FIG. 4.

As shown in FIG. 5, when a current having the same polarity as that of electrodes 402a and 404a is applied to the electrodes 402a and 404a of the lattice-shaped electrodes 402 and 404, the volume of the piezoelectric material 406 increases.

In contrast, when a current having a polarity opposite to that of electrodes 402b and 404b is applied to the electrodes 402b and 404b of the lattice-shaped electrodes 402 and 404, the volume of the piezoelectric material 406 decreases. Particularly, as the magnitude of the current of the opposite polarity applied to the electrodes 402b and 404b is larger than the magnitude of the current applied to the electrodes 402a and 404a described above, the volume of the piezoelectric material 406 is further reduced.

By applying the current as described above, the shape of the piezoelectric material 406 protrudes in the direction of an arrow in FIG. 5, so that the beam (signal) also has the directivity in the direction indicated by the arrow in FIG. 5. If the polarity of the current applied to the polarity of the electrodes 402 and 404 is different from the polarity of the electrodes 402 and 404, the protruding direction of the piezoelectric material 406 may be differently changed. Also, due to the change of the piezoelectric material 406, the direction of the beam (signal) will also be changed along the protruding direction of the piezoelectric material 406. Therefore, beam forming of the variable lens 218 is controlled in accordance with the control of the polarity and magnitude of the applied current of the controller 222, thereby achieving the communication with the directivity in the desired direction.

Figure 6:
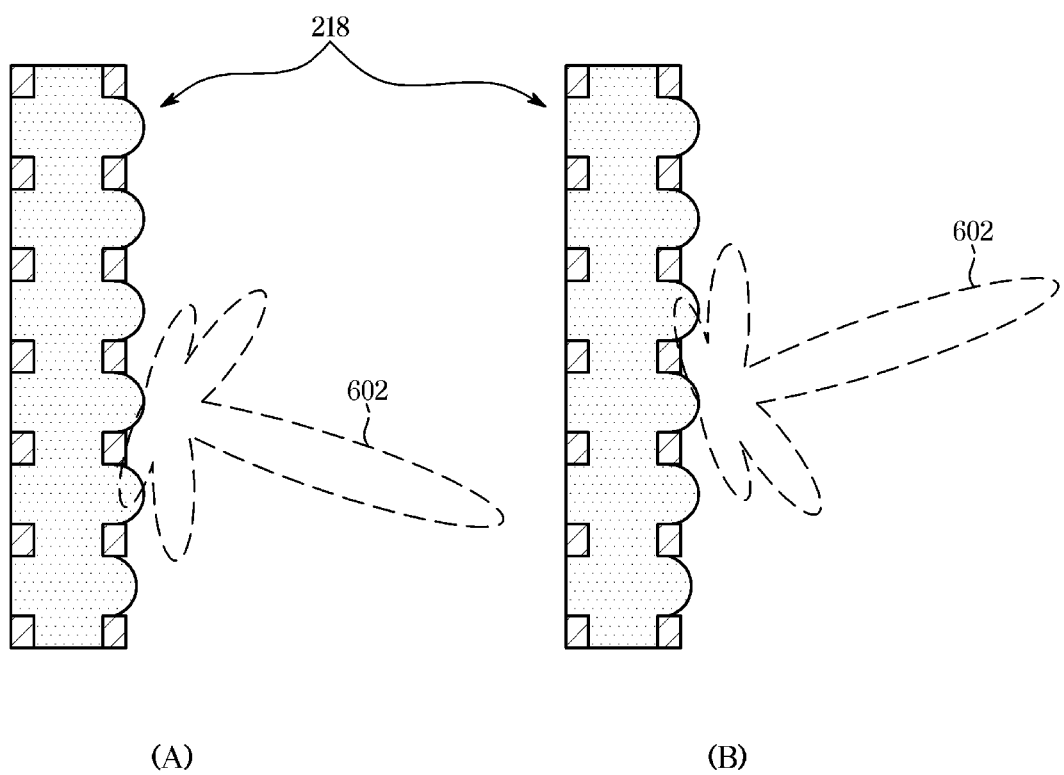
FIG. 6 is a view illustrating various forms of a directional beam of an antenna system according to an embodiment of the present disclosure.

FIG. 6 is a view illustrating various forms of a directional beam of an antenna system according to an embodiment of the present disclosure.

As shown in FIG. 6, the direction of projection of the piezoelectric material 406 is variably controlled by changing the polarity and the magnitude of the current applied to the electrodes 402 and 404 of the variable lens 218 so that the signals can be transmitted in various forms and directions such as a directional beam 602 shown in FIG. 6.

Figure 7:
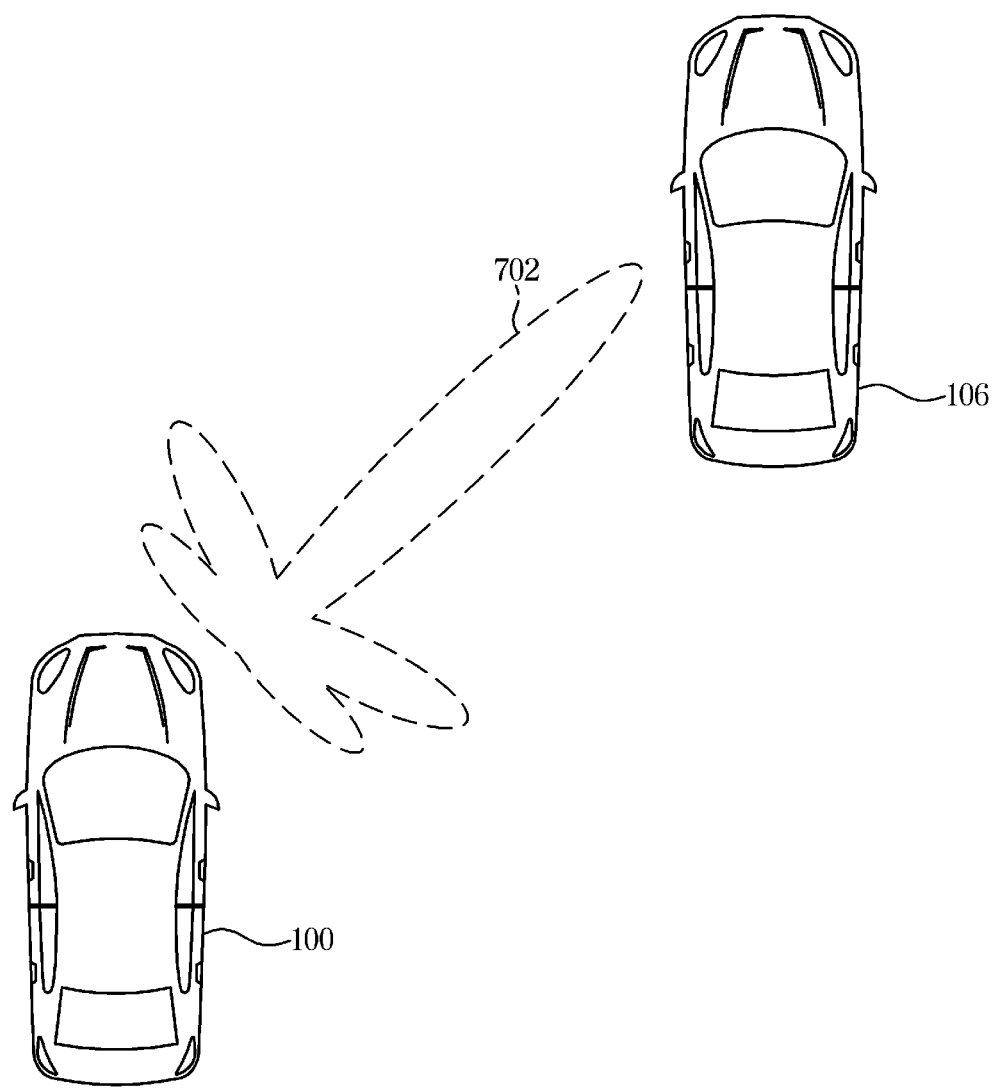
FIG. 7 is a view illustrating communication with another vehicle using an antenna system according to an embodiment of the present disclosure.

FIG. 7 is a view illustrating communication with another vehicle using an antenna system according to an embodiment of the present disclosure.

As shown in FIG. 6, the direction of projection of the piezoelectric material 406 is variably controlled by changing the polarity and the magnitude of the current applied to the electrodes 402 and 404 of the variable lens 218 so that the directional signal can be transmitted from the vehicle 100 to the desired other vehicle 106, such as a directional beam 702 shown in FIG. 7.

The above description of the present disclosure is for illustrative purposes, and a person having ordinary skilled in the art should appreciate that other specific modifications may be easily made without departing from the technical spirit or essential features of the present disclosure. Therefore, the above embodiments should be regarded as illustrative rather than limitative in all aspects. The scope of the disclosure is not to be limited by the detailed description set forth above, but by the accompanying claims of the present disclosure, and it should also be understood that all changes or modifications derived from the definitions and scope of the claims and their equivalents fall within the scope of the present disclosure.

What is claimed is:

1. An antenna system comprising: a signal processor configured to perform signal processing of a transmission signal; a signal converter configured to convert an output signal of the signal processor between analog and digital; a beam selector configured to form a desired form of a radio wave radiation pattern; and a variable lens configured to cause an output signal of the beam selector to have a directivity in a desired direction through a change in shape according to an electrical signal applied to the variable lens, wherein the variable lens includes a piezoelectric material, and an electrode comprising a plane lattice-shaped (+) polarity electrode and a plane lattice-shaped (−) polarity electrode, wherein the plane lattice-shaped (+) polarity electrode and the plane lattice-shaped (−) polarity electrode are spaced apart from each other, and wherein a space between the plane lattice-shaped (+) polarity electrode and the plane lattice-shaped (−) polarity electrode is filled with the piezoelectric material.

2. The antenna system according to claim 1, wherein the piezoelectric material contracts or expands according to an electrical signal applied to the electrode.

3. The antenna system according to claim 1, wherein a shape of the variable lens is changed by contraction or expansion of the piezoelectric material, and the output signal of the beam selector has the directivity in the desired direction in accordance with the change in shape of the variable lens.

4. The antenna system according to claim 3, wherein:
the shape of the variable lens is changed according to a change in an electrical signal applied to the electrode;
a refractive index of the variable lens is changed according to the change in shape of the variable lens; and
the directivity of the output signal of the beam selector is changed as the refractive index of the variable lens changes.

5. The antenna system according to claim 1, wherein the output signal of the beam selector having the directivity in the desired direction is transmitted to at least one of a vehicle and a mobile device.

6. A method of controlling an antenna system comprising: performing, by a signal processor, signal processing of a transmission signal; converting, by a signal converter, an output signal of the signal processor between analog and digital; forming, by a beam selector, a desired form of a radio wave radiation pattern; and applying, by control of a controller, an electrical signal to a variable lens, and causing an output signal of the beam selector to have a directivity in a desired direction through a change in shape according to an electrical signal applied to the variable lens, wherein the variable lens includes a piezoelectric material, and an electrode comprising a plane lattice-shaped (+) polarity electrode and a plane lattice-shaped (−) polarity electrode, wherein the plane lattice-shaped (+) polarity electrode and the plane lattice-shaped (−) polarity electrode are spaced apart from each other, and wherein a space between the plane lattice-shaped (+) polarity electrode and the plane lattice-shaped (-) polarity electrode is filled with the piezoelectric material.

7. The method according to claim 6, wherein the piezoelectric material contracts or expands according to the electrical signal applied to the electrode.

8. The method according to claim 6, wherein a shape of the variable lens is changed by contraction or expansion of the piezoelectric material, and the output signal of the beam selector has the directivity in the desired direction in accordance with the change in shape of the variable lens.

9. The method according to claim 8, wherein:
a shape of the variable lens is changed according to a change in the electrical signal applied to the electrode;
a refractive index of the variable lens is changed according to the change in shape of the variable lens; and
the directivity of the output signal of the beam selector is changed as the refractive index of the variable lens changes.

10. The method according to claim 6, wherein the output signal of the beam selector having the directivity in the desired direction is transmitted to at least one of a vehicle and a mobile device.

11. An antenna system comprising:
a signal processor configured to perform signal processing of a transmission signal;
a signal converter configured to convert an output signal of the signal processor between analog and digital;
a beam selector configured to form a desired form of a radio wave radiation pattern; and
a variable lens configured to comprise an electrode comprising a plane lattice-shaped (+) polarity electrode and a plane lattice-shaped (−) polarity electrode, wherein:
the plane lattice-shaped (+) polarity electrode and the plane lattice-shaped (−) polarity electrode are spaced apart from each other;
a space between the plane lattice-shaped (+) polarity electrode and the plane lattice-shaped (−) polarity electrode is filled with a piezoelectric material; and
an output signal of the beam selector has a directivity in a desired direction as the piezoelectric material contracts or expands according to an electrical signal applied to the plane lattice-shaped (+) polarity electrode and the plane lattice-shaped (−) polarity electrode.

12. The antenna system according to claim 11, wherein:
a shape of the variable lens is changed according to a change in the electrical signal applied to the electrode;
a refractive index of the variable lens is changed according to the change in shape of the variable lens; and
the directivity of the output signal of the beam selector is changed as the refractive index of the variable lens changes.

13. A method of controlling an antenna system comprising:
performing, by a signal processor, signal processing of a transmission signal;
converting, by a signal converter, an output signal of the signal processor between analog and digital;
forming, by a beam selector, a desired form of a radio wave radiation pattern; and
applying, by control of a controller, an electrical signal to a variable lens,
wherein:
the variable lens includes an electrode comprising a plane lattice-shaped (+) polarity electrode and a plane lattice-shaped (−) polarity electrode;
the plane lattice-shaped (+) polarity electrode and the plane lattice-shaped (−) polarity electrode are spaced apart from each other;
a space between the plane lattice-shaped (+) polarity electrode and the plane lattice-shaped (−) polarity electrode is filled with a piezoelectric material; and
an output signal of the beam selector has a directivity in a desired direction as the piezoelectric material contracts or expands according to an electrical signal applied to the plane lattice-shaped (+) polarity electrode and the plane lattice-shaped (−) polarity electrode.

14. The method according to claim 13, wherein:
a shape of the variable lens is changed according to a change in the electrical signal applied to the electrode;
a refractive index of the variable lens is changed according to the change in shape of the variable lens; and
the directivity of the output signal of the beam selector is changed as the refractive index of the variable lens changes.

15. A vehicle comprising:
a signal processor configured to perform signal processing of a transmission signal;
a signal converter configured to convert an output signal of the signal processor between analog and digital;
a beam selector configured to form a desired form of a radio wave radiation pattern; and
a variable lens configured to cause an output signal of the beam selector to have a directivity in a desired direction through a change in shape according to an electrical signal applied to the variable lens,
wherein the variable lens includes a piezoelectric material, and a plane lattice-shaped (+) polarity electrode and a plane lattice-shaped (−) polarity electrode,
wherein the plane lattice-shaped (+) polarity electrode and the plane lattice-shaped (−) polarity electrode are spaced part from each other, and
wherein a space between the plane lattice-shaped (+) polarity electrode and the plane lattice-shaped (−) polarity electrode is filled with the piezoelectric material.

16. A method of controlling an antenna system for a vehicle comprising:
performing, by a signal processor, signal processing of a transmission signal;
converting, by a signal converter, an output signal of the signal processor between analog and digital;
forming, by a beam selector, a desired form of a radio wave radiation pattern; and
applying, by control of a controller, an electrical signal to a variable lens, and causing an output signal of the beam selector to have a directivity in a desired direction through a change in shape according to the electrical signal applied to the variable lens,
wherein the variable lens includes a piezoelectric material and a plane lattice-shaped (+) polarity electrode and a plane lattice-shaped (−) polarity electrode,
wherein the plane lattice-shaped (+) polarity electrode and the plane lattice-shaped (−) polarity electrode are spaced apart from each other, and
wherein a space between the plane lattice-shaped (+) polarity electrode and the plane lattice-shaped (−) polarity electrode is filled with the piezoelectric material.

* * * * *